United States Patent
Berman et al.

(10) Patent No.: US 10,372,534 B2
(45) Date of Patent: Aug. 6, 2019

(54) METHOD OF OPERATING MEMORY DEVICE USING A COMPRESSED PARTY DIFFERENCE, MEMORY DEVICE USING THE SAME AND MEMORY SYSTEM INCLUDING THE DEVICE

(71) Applicant: SAMSUNG ELECTRONICS CO., LTD., Suwon-si, Gyeonggi-do (KR)

(72) Inventors: Amit Berman, Ramat Gan (IL); Uri Beitler, Ramat Gan (IL); Jun Jin Kong, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 147 days.

(21) Appl. No.: 15/270,292

(22) Filed: Sep. 20, 2016

(65) Prior Publication Data
US 2018/0081754 A1    Mar. 22, 2018

(51) Int. Cl.
| | |
|---|---|
| *G06F 11/10* | (2006.01) |
| *G11C 29/52* | (2006.01) |
| *H03M 13/09* | (2006.01) |
| *H03M 13/29* | (2006.01) |
| *H03M 13/00* | (2006.01) |
| *H03M 13/37* | (2006.01) |

(52) U.S. Cl.
CPC ........ *G06F 11/1068* (2013.01); *G06F 11/108* (2013.01); *G06F 11/1012* (2013.01); *G11C 29/52* (2013.01); *H03M 13/29* (2013.01); *H03M 13/2906* (2013.01); *H03M 13/6312* (2013.01); *H03M 13/09* (2013.01); *H03M 13/37* (2013.01); *H03M 13/3776* (2013.01)

(58) Field of Classification Search
CPC .... G06F 11/1068; G06F 11/108; G11C 29/52; H03M 13/09; H03M 13/29; H03M 13/2906; H03M 13/37; H03M 13/3776; H03M 13/6312
See application file for complete search history.

(56) References Cited

U.S. PATENT DOCUMENTS

2006/0036901 A1*  2/2006  Yang ................... G06F 11/1076
                                                        714/6.12
2012/0233521 A1*  9/2012  Kwok ............... H03M 13/2906
                                                        714/758

\* cited by examiner

*Primary Examiner* — Christian M Dorman
(74) *Attorney, Agent, or Firm* — F. Chau & Associates, LLC

(57) ABSTRACT

A memory system includes a data channel, a controller configured to output a request across the data channel, and a memory device configured to store data and corresponding first parity, perform a decoding operation on the data to generate second parity in response to receipt of the request across the data channel, generate a difference from the first parity and the second parity, compress the difference, and enable the controller to access the data and the compressed difference to satisfy the request.

13 Claims, 9 Drawing Sheets

METHOD OF OPERATING MEMORY DEVICE USING A COMPRESSED PARTY DIFFERENCE, MEMORY DEVICE USING THE SAME AND MEMORY SYSTEM INCLUDING THE DEVICE

BACKGROUND

1. Technical Field

Exemplary embodiments of the present inventive concept relate to a method of operating a memory device, a memory device using the same and a memory system including the device.

2. Discussion of Related Art

Semiconductor memory devices may be generally classified as volatile or nonvolatile. Volatile memories such as DRAM, SRAM, and the like lose stored data in the absence of applied power. In contrast, nonvolatile memories such as EEPROM, FRAM, PRAM, MRAM, flash memory, and the like are able to retained stored data in the absence of applied power. Among other types of nonvolatile memory, flash memory enjoys relatively fast data access speed, low power consumption, and dense memory cell integration density. Due to these factors, flash memory has been widely adopted for use in a variety of applications as a data storage medium.

A solid-state drive (SSD) is a solid-state storage device that uses integrated circuit assemblies as memory to store data persistently. A typical SSD includes a controller that communicates with one or more memory devices across a channel. However, a bottleneck can develop in the channel, which reduces the response time and efficiency of the SSD. Thus, there is a need for an SSD that that can reduce or prevent this bottleneck.

SUMMARY

According to an exemplary embodiment of the inventive concept, a memory system includes a data channel, a controller configured to output a request across the data channel, and a memory device configured to store data and corresponding first parity, perform a decoding operation on the data to generate second parity in response to receipt of the request across the data channel, generate a difference from the first parity and the second parity, compress the difference, and enable the controller to access the data and the compressed difference to satisfy the request.

According to an exemplary embodiment of the inventive concept, a method of controlling a memory system includes: loading, by a memory device of the memory system, data and parity in response to a request from a controller; compressing, by the memory device, a difference of the load parity and a calculated parity calculated from the loaded data to generate a compressed parity difference; and enabling, by the memory device, the controller to access the data and the compressed parity difference for satisfying the request.

According to an exemplary embodiment of the inventive concept, a memory system includes a data channel, a controller configured to output a request across the data channel; and memory device configured to store data, and a corresponding error detecting code and parity, and enable the controller to access the stored data, error detecting code, and the parity to satisfy the request. the controller is configured retrieve the data and the error detecting code across the data channel, determine whether an error is present in the data using the error detecting code, provide the data to a host when the error is determined not to be present and otherwise retrieve the parity from the memory device across the data channel for correcting the retrieved data.

According to an exemplary embodiment of the inventive concept, a method of controlling a memory system includes: retrieving, by a controller of the memory system, data and a corresponding error detecting code from a chunk of memory stored in a memory device using a data channel of the memory system; determining, by the controller, whether the retrieved data has an error using the retrieved error detecting code; providing, by the controller, the retrieved data to a host when the determining indicates the retrieved data does not have an error; and providing, by the controller, corrected data to the host using parity of the chunk, when the determining indicates the retrieved data has an error.

BRIEF DESCRIPTION OF THE DRAWINGS

The present inventive concept will become more apparent by describing in detail exemplary embodiments thereof with reference to the attached drawings, in which.

DETAILED DESCRIPTION

Figure 1:
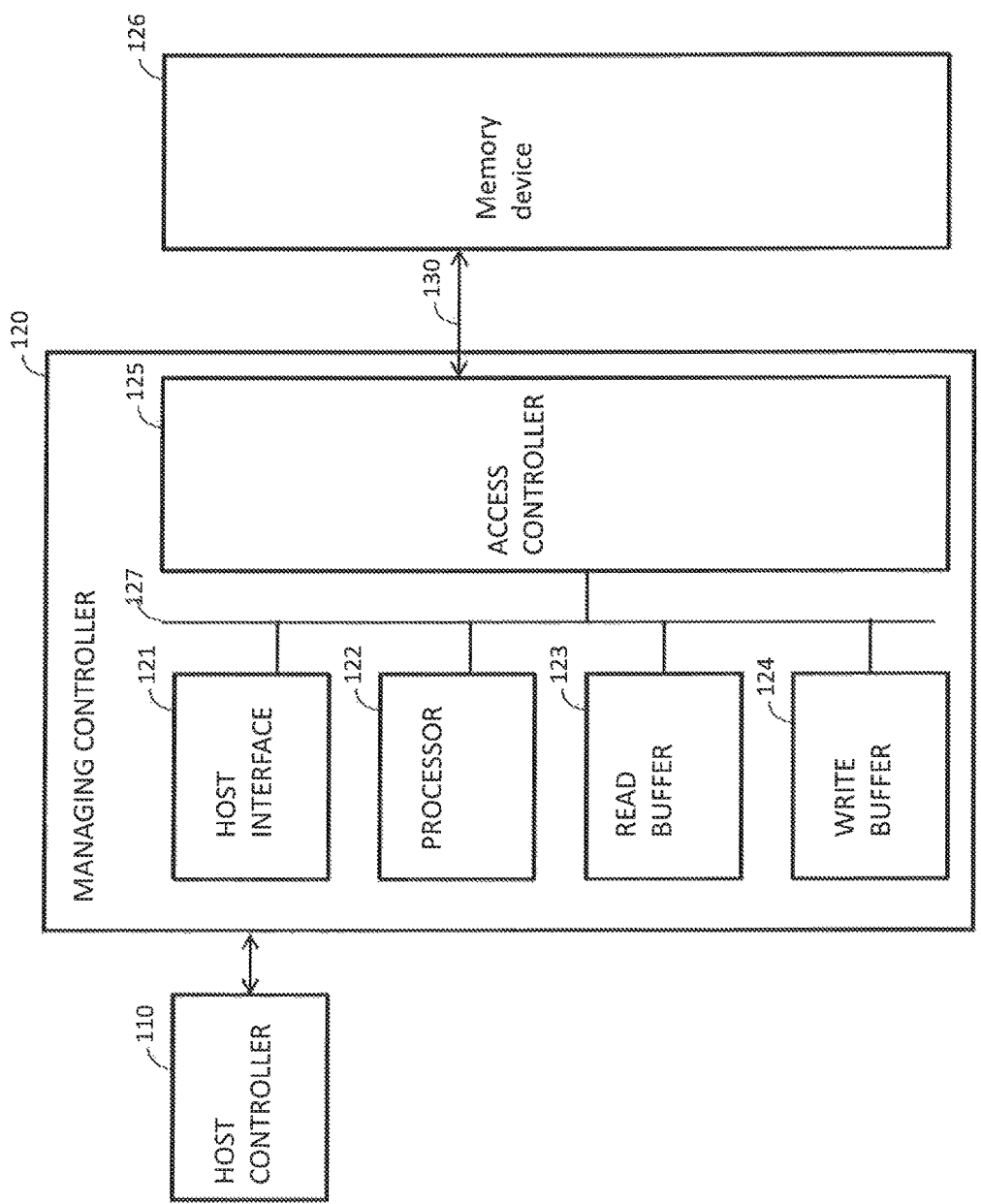
FIG. 1 is a block diagram illustrating a memory system in accordance with an exemplary embodiment of the present inventive concept.

Hereinafter, exemplary embodiments of the inventive concept in conjunction with accompanying drawings will be described. Below, details, such as detailed configurations and structures, are provided to aid a reader in understanding embodiments of the inventive concept. Therefore, embodiments described herein may be variously changed or modified without departing from embodiments of the inventive concept.

Modules in the drawings or the following detailed description may be connected with other modules in addition to the components described in the detailed description or illustrated in the drawings. Each connection between the modules or components may be a connection by communication or may be a physical connection.

FIG. 1 is a block diagram illustrating a memory system in accordance with an exemplary embodiment of the inventive concept.

Referring to FIG. 1, the memory system includes a host controller 110 and a managing controller 120 (e.g., an SSD controller).

The host controller 110 controls read and write operations of the managing controller 120 and may correspond to a central processing unit (CPU), for example. The controller 120 stores data when performing a write operation and outputs stored data when performing a read operation under the control of the host controller 110. The SSD controller includes a host interface 121, a processor 122, a read buffer 123, a write buffer 124, and an access controller 125. The access controller 125 is configured to interface with a memory device 126.

The host interface 121 may be connected with a host via any one of a Parallel AT Attachment (PATA) bus and Serial AT Attachment (SATA) bus. The host interface 121 may provide an interface with controller 125 (125a, or 125b) according to the protocol of a host (e.g., 4100). The host interface 121 may communicate with the host using Universal Serial Bus (USB), Small Computer System Interface (SCSI), PCI express, ATA, Parallel ATA (PATA), Serial ATA (SATA), or Serial Attached SCSI (SAS). The host interface 121 may perform a disk emulation function which enables the host to recognize the controller 125 (125a, or 125b) as a hard disk drive (HDD).

In an exemplary embodiment of the inventive concept, the access controller 126 is configured to perform error correction on data received from the memory device using a parity (e.g., one or more parity bits) received from the memory device.

The memory device 126 may include one or more non-volatile memory devices. In an embodiment, the non-volatile memory devices are flash memories (e.g., NAND or NOR type). In an embodiment, the memory device 126 may be implemented with a variety of non-volatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

In an embodiment, the memory device 126 includes a three-dimensional (3D) memory array. The 3D memory array may be monolithically formed in one or more physical level(s) of a memory cell array having an active area arranged on a circuit related on a silicon substrate and an operation of memory cells. The circuit related to an operation of memory cells may be located in a substrate or on a substrate. The term "monolithic" means that layers of each level of the array are directly deposited on the layers of each underlying level of the array.

In an embodiment of the inventive concept, the 3-dimensional memory array has a vertical-directional characteristic, and may include vertical NAND strings in which at least one memory cell is located on another memory cell. The at least one memory cell may comprise a charge trap layer. Each vertical NAND string may include at least one select transistor located over memory cells. The at least one select transistor having the same structure with the memory cells and being formed monolithically together with the memory cells.

The following patent documents, which are hereby incorporated by reference, describe suitable configurations for three-dimensional memory arrays, in which the three-dimensional memory array may be configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The host controller 110 exchanges signals with the managing controller 120 through the host interface 121, and the processor 122 controls the access controller 125. The read buffer 123 receives data stored in the memory device 126 and outputs the received data when a read operation is performed, and the write buffer 124 receives external data when a write operation is performed. Further, the access controller 125 controls an access operation on a memory in which data will be stored within the memory device 126 when a write operation is performed and controls an access operation on a memory in which data to be outputted is stored within the memory device 126 when a read operation is performed. Each memory of the memory device 126 stores data when a write operation is performed and outputs stored data when a read operation is performed. The access controller 125 and the memory device 126 communicate with one another through a data channel 130. While only a single memory device 126 is illustrated in FIG. 1, the inventive concept is not limited thereto. For example, the access controller 125 may communicate with multiple memory devices across multiple channels or with multiple memory devices across a single channel.

In an exemplary embodiment, the memory device 126 has a multi-plane structure. In this embodiment, the controller 125 controls each of the multiple planes so that each of the multiple planes is accessed as one unit memory.

A page read from the memory device 126 (e.g., a NVM page read) may consist of an internal array-to-buffer sensing time and transmission delay of page bytes to channel 130 to the managing controller 125. An exemplary SSD architecture may employ 8-channels, 8 ways, where each way is split into two plains that can be activated in parallel. The read response time of such a system may encounter delays due to a bottleneck in the channel (e.g., 130) used to exchange data, commands, and signals between the access controller 125 and the memory device 126. Read throughput may be improved by increasing bus frequency or the number of channels. However, the ratio of bandwidth to power consumption may worsen due to under-utilization in workloads with a small instruction queue.

At least one embodiment of the inventive concept shortens the transmission time from the memory device 126 to the controller (e.g., 120 or 125). Mild to moderate error rates occur in data are likely to result in small changes in the corresponding parity bits. Since parity may be calculated from the data, a scheme is used to transmit the data and a compressed difference between calculated and array-read parity to controller 125. Accordingly, the amount of transmitted bytes may be reduced and both latency and throughput may be improved.

At least one embodiment of the inventive concept may improve read latency. In client SSDs, common random-read workloads request 4 KB to 16 KB data with a small instruction queue, where read latency is the performance bottleneck. This may also hold for mobile NVM systems such as eMMC that contains a single channel or two channels, 1-2 ways, and one pending command.

Figure 2:
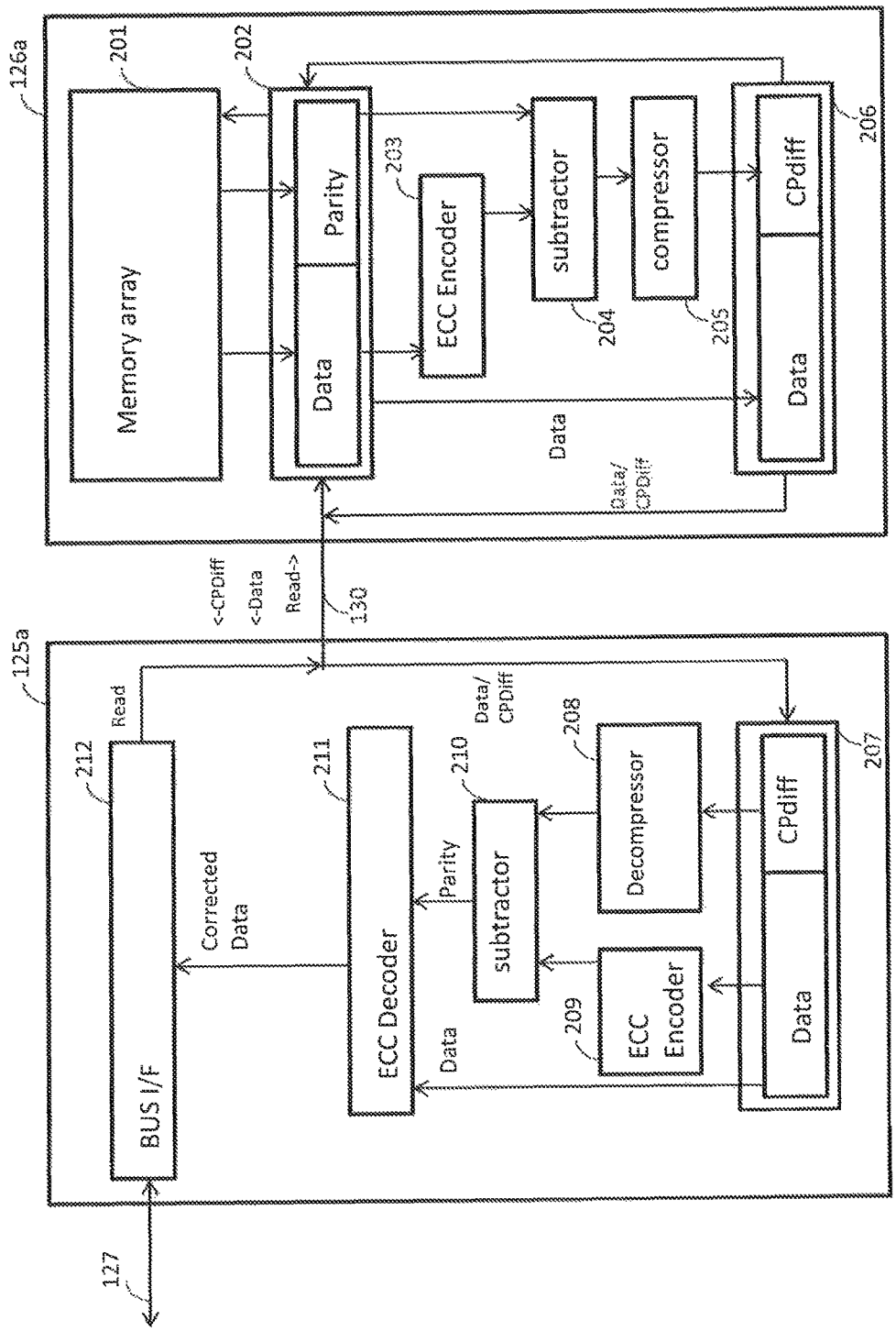
FIG. 2 is a block diagram of a controller and a memory device of FIG. 1 according to an exemplary embodiment of the inventive concept.

FIG. 2 is a block diagram of the controller and the memory device of FIG. 1 according to an exemplary embodiment of the inventive concept. For example, the controller 125 of FIG. 1 may be replaced with the controller 125a of FIG. 2. For example, the memory device 126 of FIG. 1 may be replaced with the memory 126a of FIG. 2. Read flow is modified such that after internal array-to-page buffer sensing, and error checking and correction (ECC) encoder on the memory device (e.g., a NAND memory device) calculate the parity, compare it to the one that was read from the array, and transmits the differential compression between the two parity blocks along with the data.

Referring to FIG. 2, the memory device 126a includes a memory array 201 (e.g., a NAND array), page buffer 202, an ECC encoder 203, a subtractor 204 (e.g., an XOR logic circuit), a compressor 205, and an input/output (I/O) buffer 206, and the access controller 125a includes an I/O buffer 207, a decompressor 208 (e.g., a decompression circuit), an ECC encoder 209 (e.g., an encoder circuit), a subtractor 210 (e.g., an XOR logic circuit), an ECC decoder 211 (e.g., a decoder circuit), and a bus interface 212 (e.g., a bus controller or bus interface circuit). In an exemplary embodiment, the ECC decoder 211 is a LDPC or a BCH decoder. However, embodiments of the inventive concept are not limited thereto.

A read request may be received by the bus interface 212 across bus 127 from the host. The read request may include a read command and an address. The bus interface 212 may apply the read command and the address to the page buffer 202, which uses the read command and address to retrieve a corresponding page from the memory array 201. The retrieved page includes a data portion and a corresponding parity portion. It is assumed that the memory array 201 has been previously written with the data portion and the corresponding parity portion (e.g., one or more parity or check bits).

A parity bit or a check bit may be added to a string of binary code to error correct the string or check for errors in the string. In the case of even parity, for a given set of bits, the occurrences of bits whose value is 1 is counted. If that count is odd, the parity bit value is set to 1, making the total count of occurrences of 1's in the whole set (including the parity bit) an even number. If the count of 1's in a given set of bits is already even, then parity bit's value is 0. In the case of odd parity, the coding is reversed. For a given set of bits, if the count of bits with a value of 1 is even, the parity bit value is set to 1 making the total count of 1's in the whole set (including the parity bit) an odd number. If the count of bits with a value of 1 is odd, the count is already odd so the parity bit's value is 0.

The page buffer 202 applies the data portion to an ECC encoder 203, which calculates a parity from the data portion. The parity may be used to correct the data portion. The ECC encoder 201 applies the calculated parity as a first input to a subtractor 204. The page buffer 202 applies the parity portion as a second input to the subtractor 204. The subtractor 204 performs a subtraction operation on the first input (e.g., the calculated parity) and the second input (e.g., the parity portion) to generate a parity difference.

The output of the subtractor 204 is then output to a compression circuit 205 to generate a compressed parity difference CPdiff. In an embodiment, the compression circuit 205 is configured to compress the parity difference in a lossless fashion. In an exemplary embodiment, the compression circuit 205 compresses the parity difference using a Huffman compression algorithm. The subtractor 204 and the compression circuit 205 may be implemented using less than 1 Kilo-Gates (KG).

For example, when the subtractor 204 is an XOR logic circuit, it performs an XOR operation on the first and second inputs. For example, if the first input is '1111111' and the second input is also '1111111', the result would be '0000000', a value that can be compressed greatly. For example, the result could be compressed to a single 0. However, if the first input is '0110111' and the second input is '0000000', the result would be 0110111', which cannot be compressed as much as the first example. The data portion of the page buffer 202 is stored in a data portion of an I/O buffer 206 and the output of the compression circuit 205 (e.g., CPdiff) is stored in a compressed parity difference portion of the I/O buffer 206 that corresponds to the data portion.

The controller 125 retrieves the data portion and the compressed parity difference CPdiff stored in the I/O buffer 206 of the memory device 126a across data bus 13, for storage in the I/O buffer 207 of the controller 125a. An ECC encoder 209 of the controller 125a performs an encoding operation on the data portion of the I/O buffer 207 to generate a parity portion for output to a first input of a subtractor 210 of the controller 125a. A decompression circuit 208 of the controller 125a retrieves the corresponding compressed parity difference CPdiff from the I/O buffer 206, performs a decompression operation on the compressed parity difference CPdiff to generate a decompressed result, and provides the result as a second input to the subtractor 210. The subtractor 210 performs a subtraction operation on the first and second results to generate a parity portion. In an embodiment, the subtractor 210 is an XOR logic circuit that performs an XOR operation on the first and second inputs to generate the parity portion. The ECC decoder 211 of the controller 125a performs a decoding operation on the data portion stored in the I/O buffer 207 and the parity portion output by the subtractor 210 to generated corrected data. The corrected data may be sent from the ECC decoder 211 to the bus interface 212 for output across bus 127, so the read request can be completed.

Figure 3:
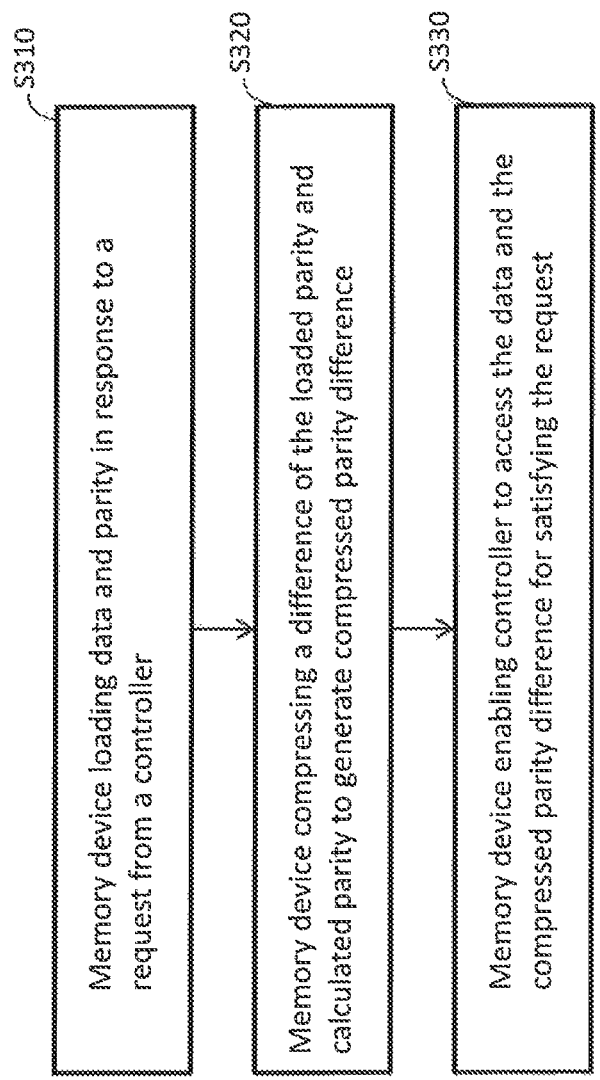
FIG. 3 illustrates a method of reading data using the controller and memory device shown in FIG. 2 according to an exemplary embodiment of the inventive concept.

FIG. 3 illustrates a method of reading data using the controller and memory device shown in FIG. 2 according to an exemplary embodiment of the inventive concept.

Referring to FIG. 3, the method includes a memory device (e.g., 126a) loading data and parity in response to a request (e.g., a read request) from a controller (S310). The method further includes the memory device compressing a difference of the loaded parity and a calculated parity (i.e., calculated from the loaded data) to generate a compressed parity difference (S320). The method then includes the memory device enabling the controller to access the data and compressed parity difference for satisfying the request (S330). For example, the memory device may place the data and the compressed parity difference into an I/O buffer of the memory device that the controller expects to be filled with the data it has requested, and which is accessible to the controller using a data bus connecting the controller to the memory device.

Figure 4:
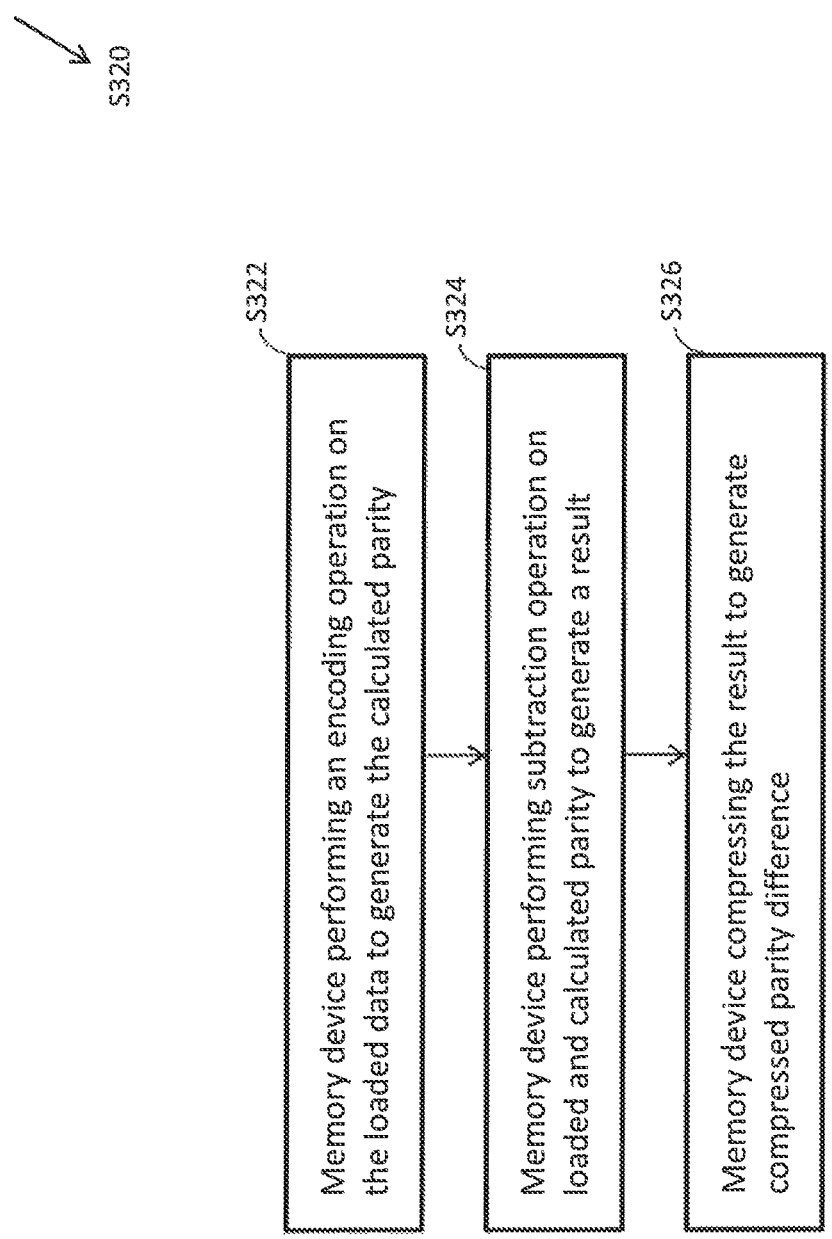
FIG. 4 illustrates a method of generated of generating a compressed parity difference for use in a controller of FIG. 2 according to an exemplary embodiment of the inventive concept.

FIG. 4 illustrates a method of generated of generating a compressed parity difference for use in a controller of FIG. 2 according to an exemplary embodiment of the inventive concept.

Referring to FIG. 4, the method includes the memory device performing an encoding operation (e.g., an ECC encoding operation) on the loaded data to generated a calculated parity (S322). The method further includes the memory device performing a subtraction operation (e.g., an XOR operation) on the loaded parity and the calculated parity to generate a result (S324). The method then includes the memory device compressing the result to generate the compressed parity difference (S326).

Figure 5:
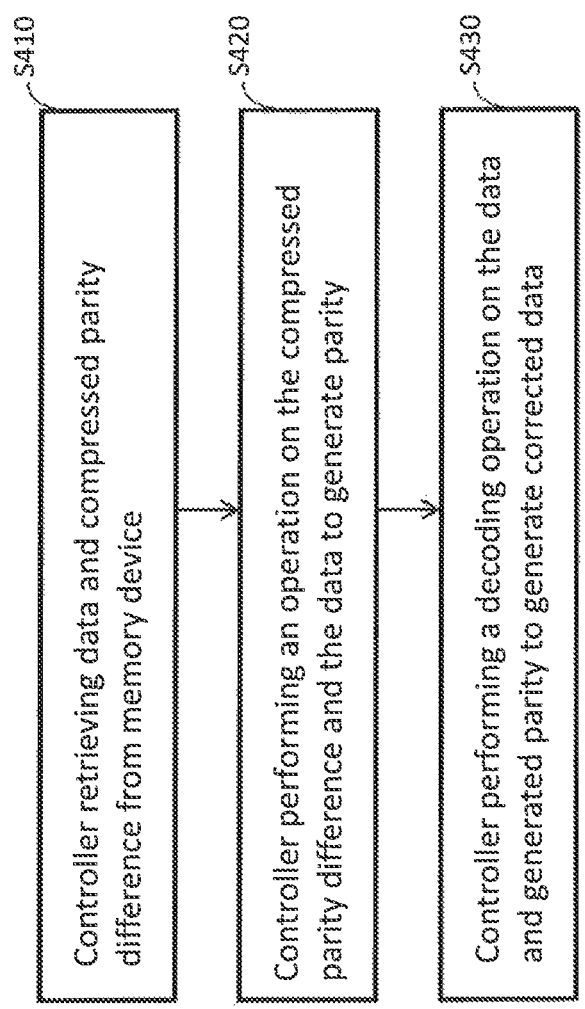
FIG. 5 illustrates a method of reading data using a controller and memory device shown in FIG. 2 according to an exemplary embodiment of the inventive concept.

FIG. 5 illustrates a method of reading data using the controller and memory device shown in FIG. 2 according to an exemplary embodiment of the inventive concept. The method of FIG. 5 may be performed after the method of FIG.

3 has been executed to make the data corresponding to the request and a compressed parity difference accessible to the controller. The method includes the controller retrieving data and the compress parity difference from the memory device (S410). For example, the controller retrieve the data and corresponding compressed parity difference from a buffer of the memory using a data bus connecting the controller and the memory device. The method then includes the controller performing an operation on the compressed parity difference and the data to generate parity (S420). The method then includes the controller performing a decoding operation (e.g., an ECC decoding operation) on the data and the generated parity to generate corrected data (S430).

Figure 6:
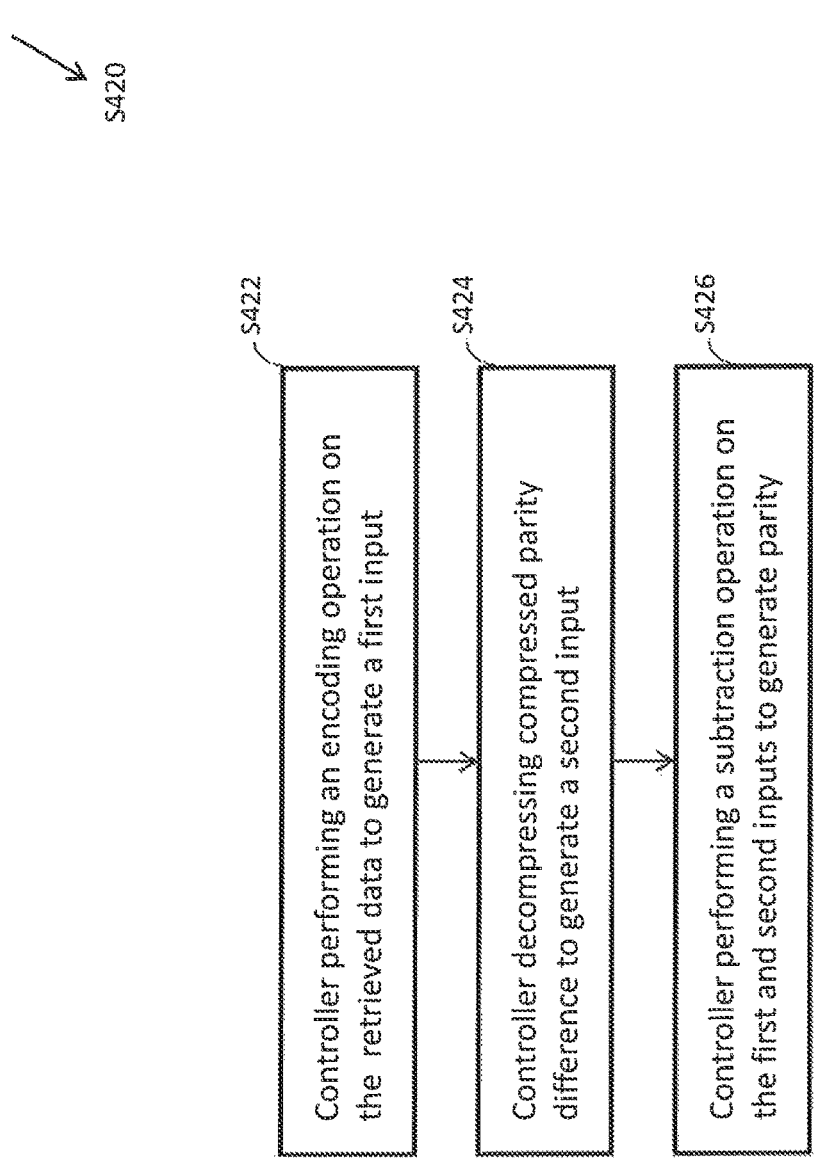
FIG. 6 illustrate a method of generating parity that may be used in the method of FIG. 4 according to an exemplary embodiment of the inventive concept.

The step S420 of performing the operation to generate the parity may be performed by the method of FIG. 6, according to an exemplary embodiment of the inventive concept. Referring to FIG. 6, the method includes the controller performing an encoding operation (e.g., an ECC encoding operation) on the retrieved data to generate a first input (S422). In an embodiment, the first input is a first parity. The method further includes the controller decompressing the compressed parity difference to generate a second input (S424). In an embodiment, the second input is a second parity. The step S424 may be performed before or after step S424. The method then includes the controller performing a subtraction (e.g., an XOR operation) on the first input (e.g., first parity) and second input (e.g., second parity) to generate the parity (S426). The generated parity corresponds to the generated parity used in step S430.

The corrected data generated by the method of FIG. 5 may be sent to a host by the controller in response a request (e.g., a read request) by the host.

The efficiency of the method shown in FIGS. 3-5 depends on the utilized ECC code. More specifically, the ratio of the average sum of changed parity bits to a bit error rate (BER) determines the compression rates. For example, in a low-density parity-check (LDPC) code, each data bit (variable node) could be connected to up to 5 check nodes. Therefore, each error in data bit leads to up to five flips at the parity bits.

Figure 7:
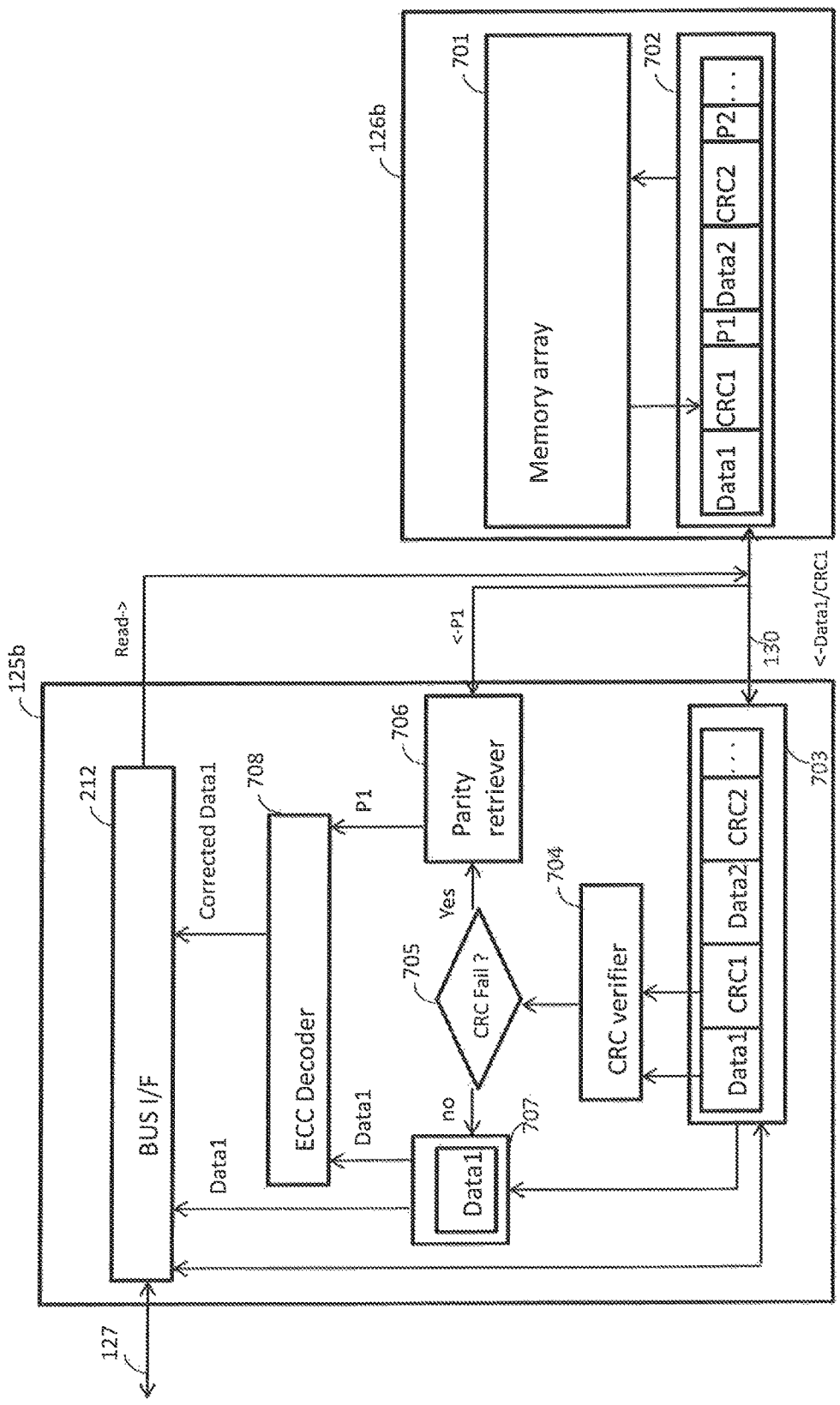
FIG. 7 is a block diagram of the controller and the memory device of FIG. 1 according to an exemplary embodiment of the inventive concept.
Figure 8:
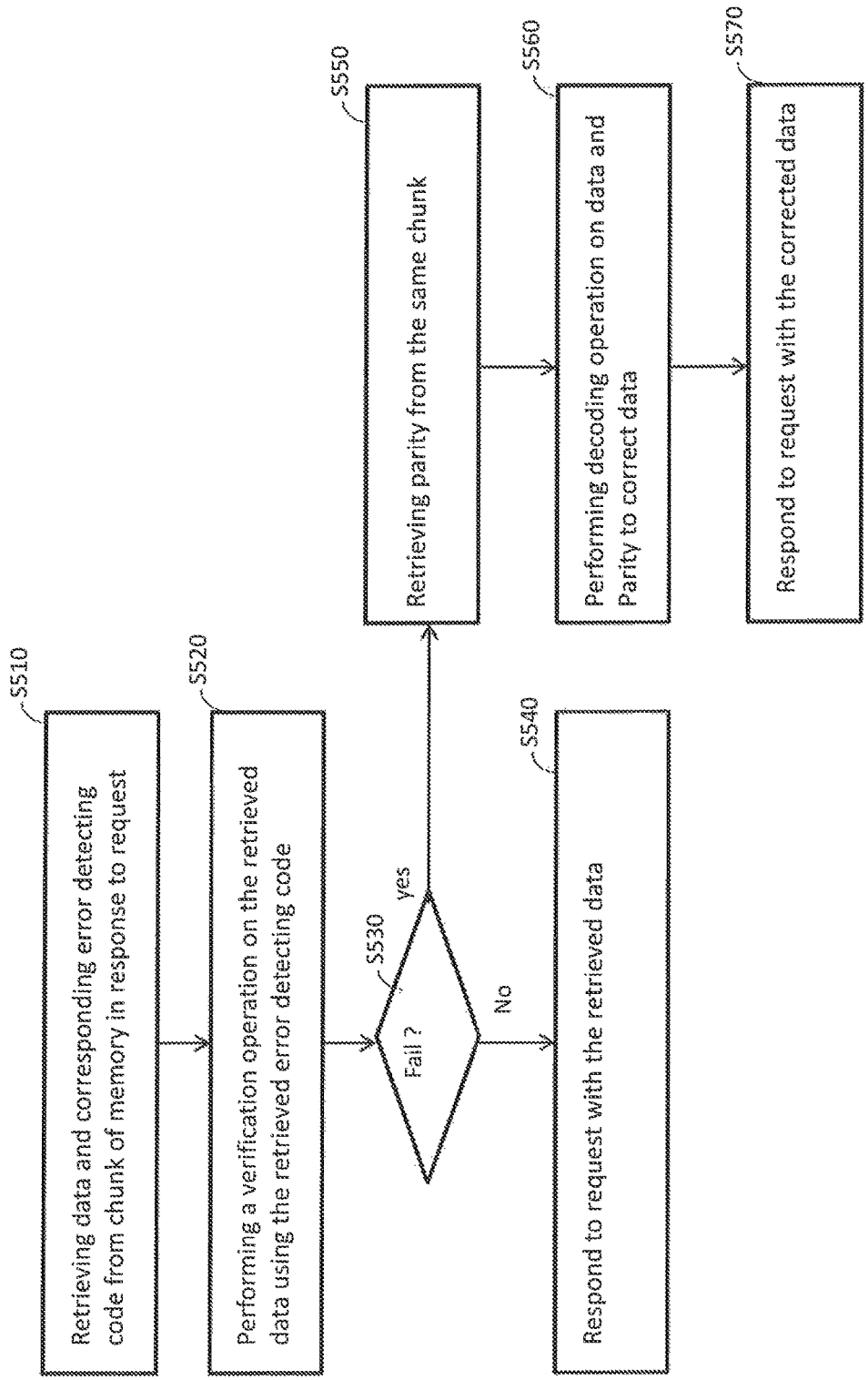
FIG. 8 illustrates a method of operating the system of FIG. 7 according to an exemplary embodiment of the inventive concept.

An embodiment of the scheme depicted in FIG. 2 makes use of an on-chip memory device hardware decoder (e.g., NAND hardware encoder), along with XOR and compression components. However, an embodiment of the inventive concept illustrated by FIG. 7 and FIG. 8 is a lower cost implementation, which does not require memory device (e.g., NAND) modifications. In this scheme, a codeword's data is divided into chunks. For each chunk, an error-detecting cyclic redundancy check (CRC) and one or more parity bits are added prior to reading into the memory device (e.g., NAND). In an embodiment, the CRC is a 32-bit value. At read, each data chunk and the corresponding CRC are verified at the controller. If errors are not the detected, the controller skips reading the associated parity. If errors are present only at ECC parity, decoding is avoided in contrast to a conventional read.

In this approach, there is a trade-off between additional CRC bits and throughout/latency improvement due to transmission time shortening. Given a data block of N-bits, the probability that the block is error free can be determined according Equation 1 as follows:

$$P_{Noiseless\ Block} = (1-BER)^N \quad [1]$$

The data vector is divided into multiple chunks, where chunk size is a parameter of BER and error-free probability. Chunk size can be dynamically tuned according to program/erase (P/E) cycles for optimal gain. The CRC code may be a Bose, Chaudhuri, and Hocquenghem (BCH) code or a LDPC code, as an example.

FIG. 7 is a block diagram of the controller and the memory device of FIG. 1 according to an exemplary embodiment of the inventive concept. For example, the controller 125 of FIG. 1 may be replaced with the controller 125b of FIG. 7. For example, the memory device 126 of FIG. 1 may be replaced with the memory 126b of FIG. 2.

Referring to FIG. 7, the memory device 126b includes the memory array 701 (e.g., a NAND array) and an I/O buffer 702. The controller 125b (e.g., an SSD controller) includes the bus interface 212, an I/O buffer 703, a CRC verification circuit 704, a determination circuit 705, a parity retrieval circuit 706, a data buffer 707, and an ECC decoder 708. The controller 125b communicates with the memory device 126b across a data channel 130. The controller 125b communicates with the host interface 127 via bus 127.

The controller 125b may receive a read request across bus 127 from the host interface 121. The read request may include a read command and a read address. The controller 125b may receive the read request using the bus interface 212, and apply the read command/read address to the I/O buffer 702 of the memory device 126b across data channel 130. It is assumed that the memory array 701 already includes data chunks and for each data chunk stores a corresponding CRC and parity. For example, if the read address corresponds to data including Data1, the I/O buffer 702 loads Data1 and its corresponding CRC1 and corresponding parity P1. In an embodiment, in addition to the request data, the buffer 702 loads other data adjacent to Data1 (e.g., Data2, CRC2, P2, etc.). For example the I/O buffer 702 could load the entire a line of a corresponding page or an entire corresponding page.

The I/O buffer 703 of the controller 125b copies data (e.g., Data1) and its corresponding CRC (e.g., CRC1) stored in the I/O buffer 702 of the memory device 126b across the data channel 130 to itself.

A CRC verification circuit 704 of the controller 125b performs a verification operation on the data (e.g., Data1) using its corresponding CRC (e.g., CRC1) to determine whether a CRC failure has occurred or not, and outputs a result that indicates whether the failure has occurred or not. If the CRC failure has not occurred, the determination circuit 705 informs the data buffer 707 to retrieve the data (e.g., Data1) and pass the data onto the bus interface 212, which can respond to the request by sending the data to the host.

If the CFC failure has occurred, the determination circuit 705 informs its parity retrieval circuit 706 to retrieve parity that corresponds to the data from the memory device 126b, outputs the parity to the ECC decoder 708, informs the data buffer 707 to output the data to the ECC decoder 708, and the ECC decoder 708 performs a decoding operation on the Data using the parity to generate corrected data. For example, if the data is Data1, then the retrieval circuit 706 retrieves parity P1 from buffer 702 using data channel 130, and the ECC Decoder 708 operates on Data1 using parity P1 to generate corrected Data1 for output to the bus interface 212, which can then respond to the request by sending the corrected data to the host.

While circuits 704-707 are illustrated as being separate elements, in an alternate embodiment, these circuits may be implemented by a lesser number of elements or a single element.

FIG. 8 illustrates a method of operating the system of FIG. 7 according to an exemplary embodiment of the inventive concept.

Referring to FIG. 8, the method includes retrieving data and a corresponding error detecting code (e.g., a CRC code) from a chunk of memory in response to a request (S510). For example, controller 125*b* may retrieve the data and corresponding error detecting code from memory device 126*b* using data channel 130.

The method further includes performing a verification operation on the retrieved data using the retrieved error detecting code (S520). For example, the controller 125*b* may perform a verification operation on the retrieved data using a corresponding retrieved CRC to output a verification result.

The method further includes determining whether the result indicates a failure has occurred (S530). For example, the result could be a first value (e.g., 1) to indicate a success and a second other value (e.g., 0) to indicate a failure.

If the method determines a success has occurred, the method proceeds to S540, which responds to the request with the retrieved data. For example, the controller 125*b* may respond to the host with the retrieved data.

If the method determines a failure has occurred, the method proceeds to S550, which retrieves parity from the same chunk of memory. For example, the controller 125*b* can retrieve the parity that corresponds to the data from the memory device 125*b* using data channel 130.

The method then includes performing a decoding operation on the retrieved data using the retrieved parity to generate corrected data (S560). For example, the controller 125*b* may use an internal ECC decoder circuit (e.g., 708) to perform the decoding operation.

The method next includes responding to the request using the corrected data (S570). For example, the controller 125*b* may respond to the host with the corrected data.

The above-described methods may be tangibly embodied on one or more computer readable medium(s) (i.e., program storage devices such as a hard disk, magnetic floppy disk, RAM, ROM, CD ROM, Flash Memory, etc., and executable by any device or machine comprising suitable architecture, such as a general purpose digital computer having a processor, memory, and input/output interfaces).

Figure 9:
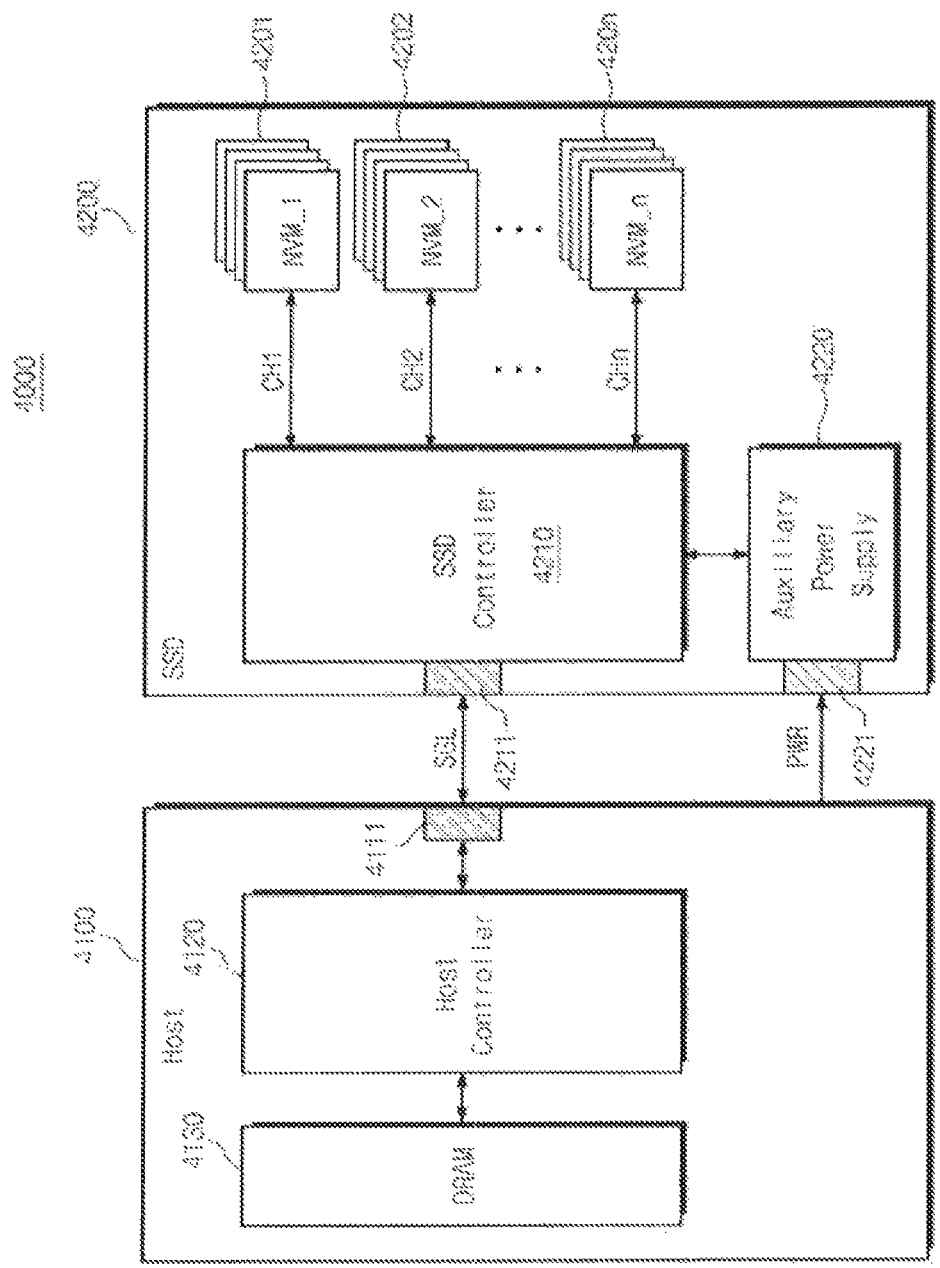
FIG. 9 is a block is a block diagram illustrating a solid state drive system according to an exemplary embodiment of the inventive concept.

FIG. 9 is a block is a block diagram illustrating a solid state drive system according to an exemplary embodiment of the inventive concept. Referring to FIG. 9 a solid state drive (SSD) system 4000 includes a host 4100 and an SSD 4200. The host 4100 includes a host interface 4111, a host controller 4120, and a DRAM 4130.

The host 4100 may write data in the SSD 4200 or read data from the SSD 4200. The host controller 4120 may transfer signals SGL such as a command, an address, a control signal, and the like to the SSD 4200 via the host interface 4111. The DRAM 4130 may be a main memory of the host 4100.

The SSD 4200 may exchange signals SGL with the host 4100 via the host interface 4211, and may be supplied with a power via a power connector 4221. The SSD 4200 may include a plurality of nonvolatile memories 4201 through 420*n*, an SSD controller 4210, and an auxiliary power supply 4220. Herein, the nonvolatile memories 4201 to 420 *n* may be implemented by not only a flash memory but also PRAM, MRAM, ReRAM, and the like. The SSD controller 4210 may be implemented by the controller 125*a* of FIG. 2 or the controller 125*b* of FIG. 7. Each of the memory devices 4201 through 420*n* may be implemented by the memory device 126*a* of FIG. 2 or the memory device 126*b* of FIG. 7.

The plurality of nonvolatile memories 4201 through 420 *n* may be used as a storage medium of the SSD 4200. The plurality of nonvolatile memories 4201 to 420 *n* may be connected with the DDS controller 4210 via a plurality of channels CH1 to CHn. One channel may be connected with one or more nonvolatile memories. Each of the channels CH1 to CHn may correspond to the data channel 130 depicted FIG. 2 and FIG. 7. Nonvolatile memories connected with one channel may be connected with the same data bus.

The SSD controller 4210 may exchange signals SGL with the host 4100 via the host interface 4211. Herein, the signals SGL may include a command, an address, data, and the like. The SSD controller 4210 may be configured to write or read out data to or from a corresponding nonvolatile memory according to a command of the host 4100.

The auxiliary power supply 4220 may be connected with the host 4100 via the power connector 4221. The auxiliary power supply 4220 may be charged by a power PWR from the host 4100. The auxiliary power supply 4220 may be placed within the SSD 4200 or outside the SSD 4200. For example, the auxiliary power supply 4220 may be put on a main board to supply an auxiliary power to the SSD 4200.

Although the present inventive concept has been described in connection with exemplary embodiments thereof, those skilled in the art will appreciate that various modifications can be made to these embodiments without substantially departing from the principles of the present inventive concept.

What is claimed is:

1. A memory system comprising:
   a data channel;
   a controller configured to output a request across the data channel; and
   a memory device configured to store data and corresponding first parity, perform an encoding operation on the data to generate second parity in response to receipt of the request across the data channel, generate a difference from the first parity and the second parity, compress the difference to generate a compressed parity difference, and store the data and the compressed parity difference in a buffer of the memory device,
   wherein the controller is configured to retrieve the data and the compressed parity difference from the buffer across the data channel after outputting the request, and generate corrected data using the retrieved data and the retrieved compressed parity difference.

2. The memory system of claim 1, wherein the memory device comprises an error checking and correction (ECC) encoder configured to perform the encoding operation.

3. The memory system of claim 1, wherein the memory device comprises a subtractor configured to perform a subtraction operation on the first parity and the second parity to generate the difference.

4. The memory system of claim 3, wherein the subtractor is an XOR logic circuit.

5. The memory system of claim 1, wherein the memory device comprises a compression circuit and the compress of the difference is performed by the compression circuit.

6. The memory system of claim 1, wherein the buffer is an input/output (I/O) buffer.

7. The memory system of claim 1, wherein the controller comprises:
   an error checking and correction (ECC) encoder configured to perform an encoding operation on the retrieved data to generate a first result; and
   a decompression circuit configured to perform a decompression operation on the retrieved compressed parity difference to generate a second result, wherein the controller generates the corrected data using the retrieved data, the first result, and the second result.

8. The memory system of claim 7, the controller further comprising:
   a subtractor configured to perform a subtraction operation on the first result and the second result to generate a restored parity; and
   an ECC decoder configured to perform a decoding operation on the retrieved data and the restored parity to generate the corrected data.

9. The memory system of claim 8, wherein the subtractor is an XOR logic circuit.

10. A method for controlling a memory system, the method comprising:
   loading, by a memory device of the memory system, data and parity in response to receiving a request across a data channel from a controller;
   compressing, by the memory device, a difference of the loaded parity and a calculated parity calculated from the loaded data to generate a compressed parity difference;
   storing, by the memory device, the loaded data and the compressed parity difference in a buffer of the memory device;
   retrieving, by the controller, the loaded data and the compressed parity difference from the buffer across the data channel after outputting the request; and
   generating, by the controller, corrected data using the retrieved loaded data and the retrieved compressed parity difference.

11. The method of claim 10, wherein the compressing comprises:
   performing, by the memory device, an encoding operation on the loaded data to generate the calculated parity;
   performing, by the memory device, a subtraction operation on the loaded parity and the calculated parity to generate a result; and
   compressing, by the memory device, the result to generate the compressed parity difference.

12. The method of claim 10, wherein the controller generates the corrected data by:
   performing an operation on the retrieved compressed parity difference and the retrieved loaded data to generate restored parity; and
   performing a decoding operation on the retrieved loaded data and the restored parity to generate the corrected data.

13. The method of claim 12, wherein the performing of the operation comprises:
   performing, by the controller, an encoding operation on the retrieved loaded data to generate a first input;
   decompressing, by the controller, the retrieved compressed parity difference to generate a second input; and
   performing, by the controller, a subtraction operation on the first input and the second input to generate the restored parity.

* * * * *